(12) United States Patent
Ding et al.

(10) Patent No.: US 8,890,585 B2
(45) Date of Patent: Nov. 18, 2014

(54) FREQUENCY MULTIPLIER AND ASSOCIATED METHOD

(71) Applicant: MStar Semiconductor, Inc., Hsinchu Hsien (TW)

(72) Inventors: Jian-Yu Ding, ChuPei (TW);
Shih-Chieh Yen, ChuPei (TW);
Ming-Yu Hsieh, ChuPei (TW); Yao-Chi Wang, ChuPei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 23 days.

(21) Appl. No.: 13/675,264

(22) Filed: Nov. 13, 2012

(65) Prior Publication Data
US 2014/0132313 A1    May 15, 2014

(51) Int. Cl.
*H03B 19/00* (2006.01)
(52) U.S. Cl.
CPC .................................. *H03B 19/00* (2013.01)
USPC .......................................... 327/116; 327/119

(58) Field of Classification Search
USPC .................................................. 327/116, 119
See application file for complete search history.

(56) References Cited

U.S. PATENT DOCUMENTS

| | | | | |
|---|---|---|---|---|
| 3,914,760 A | * | 10/1975 | Logue | 341/111 |
| 5,563,921 A | * | 10/1996 | Mesuda et al. | 375/376 |
| 5,760,623 A | * | 6/1998 | Hastings | 327/137 |
| 6,625,045 B1 | * | 9/2003 | Lethellier | 363/89 |
| 7,075,346 B1 | * | 7/2006 | Hariman et al. | 327/116 |

FOREIGN PATENT DOCUMENTS

JP            60253317 A    * 12/1985    ........... H03K 12/00

* cited by examiner

*Primary Examiner* — Ryan Jager
(74) *Attorney, Agent, or Firm* — Edell, Shapiro & Finnan, LLC

(57) ABSTRACT

A frequency multiplier and associated method are provided, wherein the frequency multiplier includes a waveform generator and a slicer. The waveform generator generates a waveform in response to an input signal, and the slicer induces transitions in an output signal whenever the waveform crosses each of a plurality of reference levels, such that a frequency of the output signal is a multiple of a frequency of the input signal.

8 Claims, 6 Drawing Sheets

FREQUENCY MULTIPLIER AND ASSOCIATED METHOD

FIELD OF THE INVENTION

The present invention relates to a frequency multiplier and associated method, and more particularly, to a frequency multiplier and associated method capable of implementing an odd-numbered, an arbitrary, and/or a programmable multiple of an input frequency.

BACKGROUND OF THE INVENTION

Frequency manipulation, including clock/frequency generation and synthesizing, is of key importance for modern electronic devices. For example, sequential logic circuits, e.g., processors and controllers, need to be triggered by clocks for proper operation; and transmitters, receivers and/or transceivers of communication, network, broadcasting and/or positioning systems require signals of specific frequencies for signal processing, modulation and/or demodulation, etc.

Frequency multiplication, which is proved to be very useful for frequency manipulation, aims to provide an output signal whose frequency is a multiple of an input frequency, i.e., the frequency of the output signal equals a product of a multiplication factor and the input frequency. One prior art approach of frequency multiplication manages to provide a multiplication factor of 2 or 4/3 by digital operations if an in-phase signal of the input frequency and a quadrature phase signal of the input frequency are both available; however, this approach lacks flexibility since it fails to provide multiplication factors of arbitrary numbers. Another prior art approach provides multiplication factors of even numbers, but not odd numbers.

Still another prior art approach utilizes analog mixing to implement frequency multiplication, but such an approach suffers from undesired harmonics. Low frequency harmonics or inter-modulation are difficult to be filtered out, and will cause spurious signals in the circuit. Though harmonics of high frequencies can be filtered out by inductor-capacitor (LC) tank or resistor-capacitor (RC) tank circuit, such additional filtration has the disadvantages of large layout areas and high cost. Additionally, the output frequency for an LC tank circuit is the LC resonant frequency which is strongly dependent on the implemented LC value, and thus hard to be programmable.

SUMMARY OF THE INVENTION

To address issues of the aforementioned prior art approaches, the invention provides a frequency multiplier and associated method capable of providing multiplication factors of arbitrary numbers, including odd numbers. In addition, the multiplication factor can be programmable for maximal flexibility.

An objective of the invention is providing a frequency multiplier which provides an output signal in response to an input signal of an input frequency, and includes a waveform generator for generating a waveform in response to the input signal, and a slicer which is coupled to the waveform generator for inducing transitions in the output signal whenever the waveform crosses each of a plurality of reference levels.

In an embodiment, the waveform generator shapes the waveform into an ascending ramp when the input signal is of a first logic level, and shapes the waveform into a descending ramp when the input signal is of a second logic level.

In an embodiment, the frequency multiplier further includes a plurality of comparators. Each of the comparators is coupled between the waveform generator and the slicer, and is arranged to provide a comparison result in response to a comparison between the waveform and one of the reference levels; the slicer is arranged to induce transitions in the output signal in response to the comparison results of the comparators. In an embodiment, a number or all of the reference levels are programmable, and the slicer is capable of inducing transitions in the output signal in response to a programmable subset of the comparison results. In an embodiment, a period of the input signal is a multiplication of a multiplication factor and a period of the output signal, and, the reference levels and the subset are programmed according to the multiplication factor. In an embodiment, the frequency multiplier further includes a plurality of selection circuits and a voltage provider; each selection circuit is coupled to one of the comparators, and is arranged to provide one of the reference levels by selecting it from a plurality of candidate reference levels. The voltage provider is arranged to provide the candidate reference levels for each of the selection circuits.

In an embodiment, the frequency multiplier further includes a converter for periodically converting a sample of the waveform to a digital code, and the slicer is arranged to induce the transition in the output signal when consecutive digital codes cross one of the reference levels.

In an embodiment, each of the reference levels is a fraction of a peak-to-peak magnitude of the waveform; for example, the reference levels equally divide the peak-to-peak magnitude.

An objective of the invention is providing a method for frequency multiplication, which provides an output signal in response to an input signal, and includes: generating a waveform in response to the input signal, and inverting the output signal whenever the waveform intersects each of a plurality of reference levels. In an embodiment, generating the waveform includes: shaping the waveform into an ascending ramp when the input signal is of a first logic level, and shaping the waveform into a descending ramp when the input signal is of a second logic level.

In an embodiment, the method further includes: by each of a plurality of comparators, comparing the waveform with one of the reference levels to provide a comparison result, so as to invert the output signal in response to the comparison results of the comparators.

In an embodiment, the method further includes: determining a multiplication factor, determining a quantity of the reference levels according to the multiplication factor, and setting values of the reference levels according to the multiplication factor, such that a period of the input signal is a multiplication of the multiplication factor and a period of the output signal.

In an embodiment, each of the reference levels is set according to a multiple of a quotient dividing a peak-to-peak magnitude of the waveform by the multiplication factor. In an embodiment, the method further includes: measuring the peak-to-peak magnitude of the waveform.

In an embodiment, the method further includes: by a converter, periodically converting a sample of the waveform to a digital code, so as to invert the output signal when consecutive digital codes intersect one of the reference levels.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
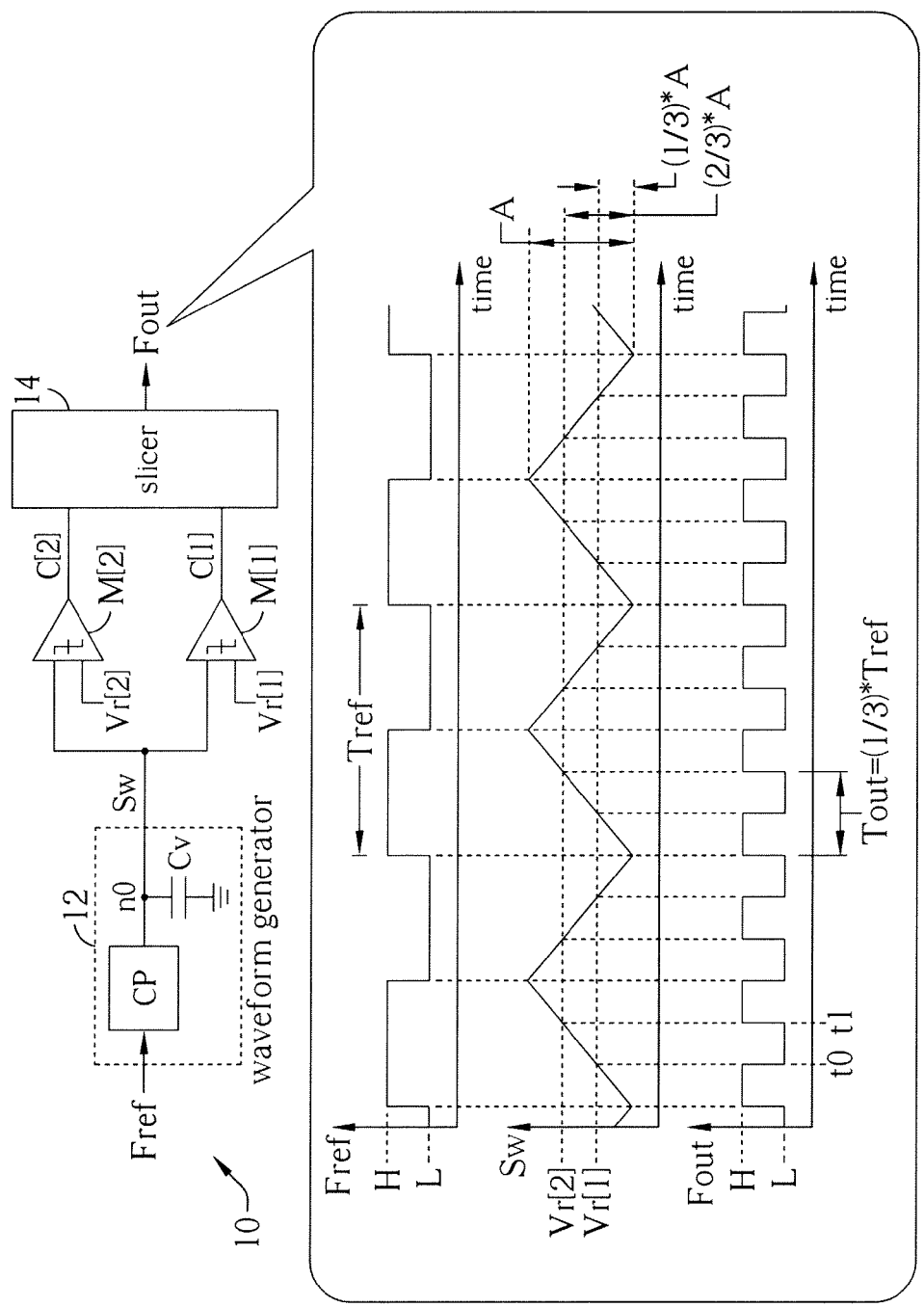
FIG. 1 illustrates a frequency multiplier according to an embodiment of the invention.

Reference is made to FIG. 1, which illustrates a frequency multiplier 10 according to an embodiment of the invention. The frequency multiplier 10 receives a signal Fref as an input signal and provides a signal Fout as an output signal, such that a frequency (or a clock rate) of the signal Fout is a multiple of a frequency of the signal Fref. In the example of FIG. 1, the frequency multiplier 10 provides a multiplication factor equal to 3, that is, the frequency of the signal Fout is a 3 multiple of the frequency of the signal Fref; or equivalently, a period Tref of the signal Fref equals a product of 3 and a period Tout of the signal Fout.

The frequency multiplier 10 includes a waveform generator 12, two comparators M[1] and M[2], and a slicer 14. The waveform generator 12 is arranged to generate a waveform Sw in response to the signal Fref. For example, the signal Fref can be a clock of 50% duty which periodically alternates between two logic levels H and L, and the waveform generator 12 can include a charge pump CP and a capacitor Cv coupled to the charge pump CP via a node n0. The charge pump CP charges and discharges the capacitor Cv in response to the signal Fref, so as to build up the waveform Sw at the node n0. For example, when the signal Fref is of the level H, the charge pump CP charges the capacitor Cv, so the waveform generator 12 shapes the waveform Sw into an ascending ramp; on the other hand, when the signal Fref is of the level L, the charge pump CP discharges the capacitor Cv, hence the waveform generator 12 shapes the waveform Sw into a descending ramp. Accordingly, the waveform Sw is a saw-tooth waveform whose period equals the period Tref of the signal Fref.

Each of the comparators M[1] and M[2] is coupled between the waveform generator 12 and the slicer 14. The comparator M[1] provides a comparison result C[1] by comparing the waveform Sw and a reference level Vr[1]. Similarly, the comparator M[2] provides a comparison result C[2] in response to a comparison between the waveform Sw and another reference level Vr[2]. In an embodiment, each of the reference levels Vr[1] and Vr[2] is a fraction of a peak-to-peak magnitude A of the waveform Sw. For example, the reference levels Vr[1] and Vr[2] can respectively be (⅓)*A and (⅔)*A which equally divide the peak-to-peak magnitude A.

In response to the comparison results C[1] and C[2], the slicer 14 induces transitions in the output signal Fout whenever the waveform Sw crosses any one of the reference levels Vr[1] and Vr[2]. For example, at a time t0, the waveform Sw intersects the reference level Vr[1], and the comparison result C[1] of the comparator M[1] is therefore inverted after the time t0; in response, the slicer 14 causes the signal Fout to transit from the logic level H to the logic level L. Similarly, at a time t1, the waveform Sw originally below the reference level Vr[2] increase above the reference level Vr[2], the comparison result C[2] of the comparator M[2] tracks to invert after the time t1, and the slicer 14 causes the signal Fout to transit from the logic level L to the logic level H.

As shown in FIG. 1, because the reference levels Vr[1] and Vr[2] are set to equally divide the peak-to-peak magnitude A of the linearly ascending ramp and the linearly descending ramp of the waveform Sw, transitions induced by the slicer 14 in the signal Fout equally divide the period Tref to 6 equal intervals or equivalently 3 periods Tout, and thus a frequency multiplication of a multiplication factor 3 is achieved.

From the example of FIG. 1, it is understood that the frequency multiplier of the invention can be generalized to provide arbitrary multiplication factor. To provide a multiplication factor N, (N−1) comparators M[1] to M[N−1] are included in the frequency multiplier, each comparator M[n] compares the waveform Sw and a reference level Vr[n] which is set according to n*(A/N) for n=1 to (N−1). Thus, the slicer transits the signal Fout whenever the waveform Sw intersects any reference level Vr[n], such that the period Tout of the signal Fout is (1/N)*Tref.

Figure 2:
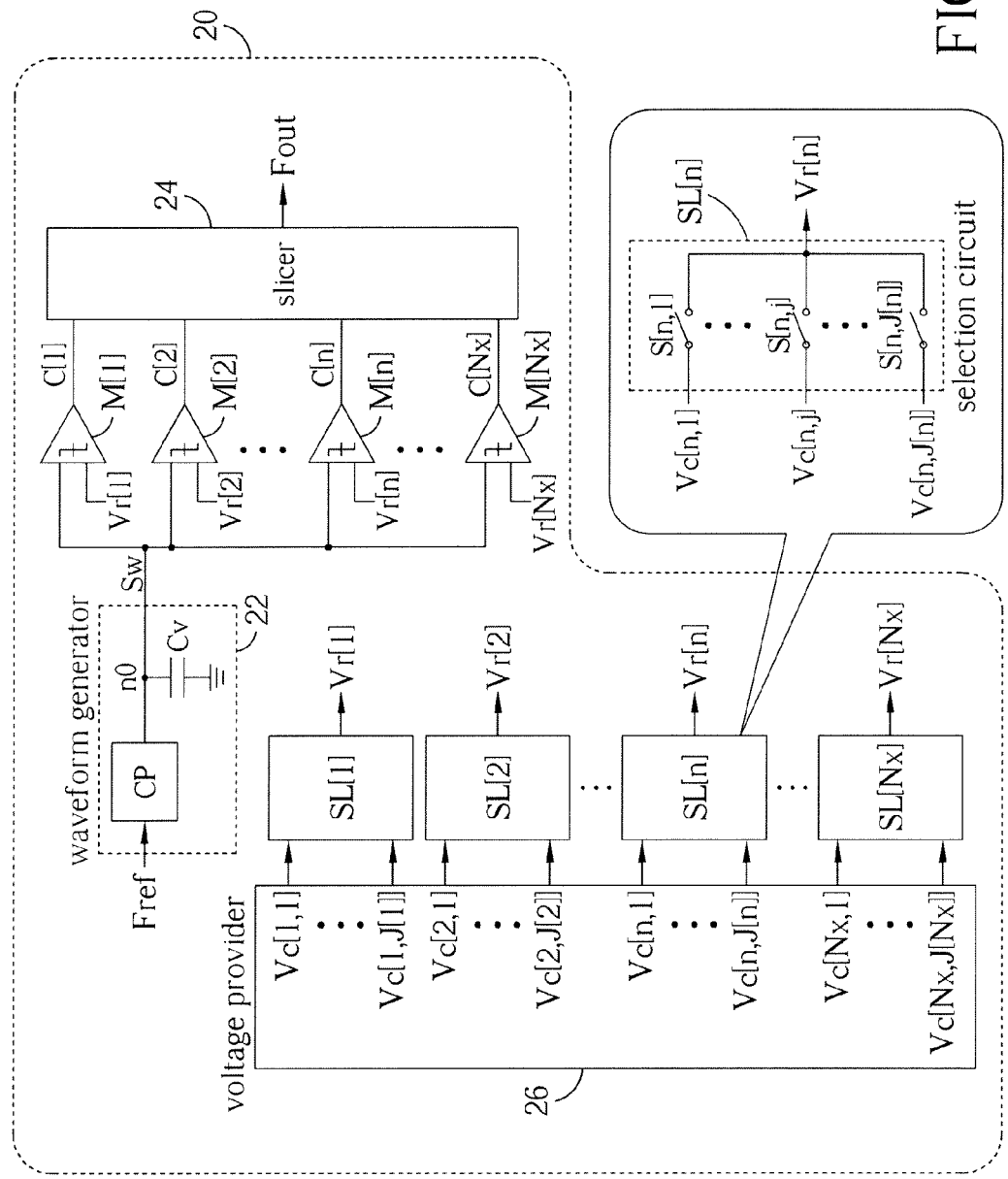
FIG. 2 illustrates a frequency multiplier according to an embodiment of the invention.
Figure 3:
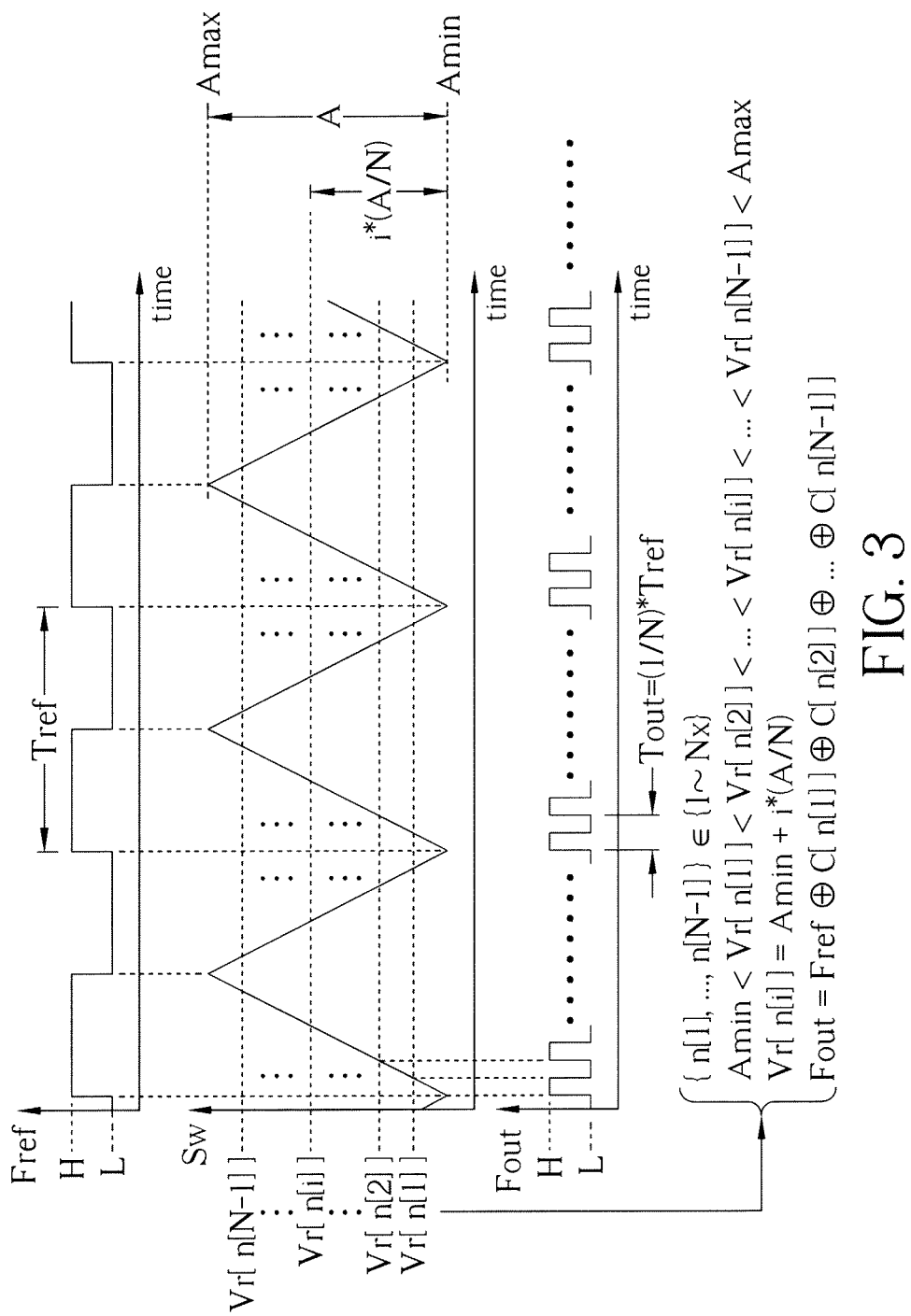
FIG. 3 illustrates operation of the frequency multiplier shown in FIG. 2 according to an embodiment of the invention.

Reference is now made to FIG. 2 and FIG. 3, FIG. 2 illustrates a frequency multiplier 20 according to an embodiment of the invention, and FIG. 3 illustrates operation of the frequency multiplier 20 according to an embodiment of the invention. The frequency multiplier 20 is capable of providing a programmable multiplication factor between a signal Fref and a signal Fout, and includes a waveform generator 22, comparators C[1] to C[Nx], a slicer 24, selection circuits SL[1] to SL[Nx], and a voltage provider 26. Similar to the waveform generator 12 of FIG. 1, the waveform generator 22 provides a saw-tooth waveform Sw in response to the signal Fref, such that a period of the waveform Sw equals a period Tref of the signal Fref.

Each comparator M[n] of the comparators M[1] to M[Nx] is coupled between the waveform generator 22 and the slier 24 for providing a comparison result C[n] in response to a comparison between the waveform Sw and an associated reference level Vr[n]. Each selection circuit SL[n] of the selection circuits SL[1] to SL[Nx] is coupled to the comparator M[n] for providing the reference level Vr[n] by selecting it from candidate reference levels Vc[n, 1] to Vc[n, J[n]]. The reference level Vr[n] is therefore programmable since it can be programmed (selected) to be any one of the candidate reference levels Vc[n, 1] to Vc[n, J[n]]. As shown in FIG. 2, each selection circuit SL[n] can include switches S[n, 1] to S[n, J[n]], each switch S[n, j] selectively conducts a candidate reference level Vc[n, j] to become the reference level Vr[n]. The voltage provider 26 is coupled to the selection circuits SL[1] to SL[Nx] for providing the candidate reference levels V[n, 1] to V[n, J[n]] for each selection circuit SL[n].

To provide a multiplication factor N, (N−1) selection circuits SL[n[1]] to SL[n[N−1]] respectively provides reference levels Vr[n[1]] to Vr[n[N−1]] to associated comparators M[n[1]] to M[n[N−1]], wherein the reference levels Vr[n[1]] to Vr[n[N−1]] equally divide a peak-to-peak magnitude A between a minimal level Amin and a maximal level Amax of the waveform Sw (FIG. 3); that is, the reference level Vr[n[i]] of the reference levels Vr[n[1]] to Vr[n[N−1]] equals (Amin+ i*(A/N)). In response to the comparison results C[n[1]] to C[n[N−1]] of the comparators M[n[1]] to M[n[N−1]], the slicer 24 inverts the signal Fout whenever it intersects one of the reference levels Vr[n[1]] to Vr[n[N−1]], and hence the period Tref of the signal Fref is divided to N periods Tout of the signal Fout. That is, the period Tout of the signal Fout can be expressed by Tout=Tref/N. Equivalently, the signal Fout can be obtained by exclusive-or operations of the comparison results C[n[1]] to C[n[N−1] and the signal Fref, as shown in FIG. 3.

For example, assuming that the frequency multiplier 20 includes 7 comparators M[1] to M[7] and associated 7 selection circuits SL[1] to SL[7]. When the frequency multiplier 20 is programmed to provide a multiplication factor equal to 3, 2 selection circuits SL[n1] and SL[n2] among the selection circuits SL[1] to SL[7] respectively provide reference levels Vr[n1]=(Amin+A/3) and Vr[n2]=(Amin+2*(A/3)) to the associated 2 comparators M[n1] and M[n2] among the comparators M[1] to M[7]; in response to the comparison results C[n1] and C[n2], the slicer 24 transits the signal Fout whenever it crosses one of the reference levels Vr[n1] and Vr[n2], or equivalently, generates the signal Fout by (Fref⊕C[n1]⊕C[n2]). Because comparison results other than the 2 comparison results C[n1] and C[n2] are not referred to for generation of the signal Fout, they are ignored by the slicer 24; and/or, comparators other than the 2 comparators M[n1] and M[n2] can be disabled or powered down.

If the frequency multiplier 20 with 7 comparators and 7 selection circuits is programmed to provide a multiplication factor equal to 5, 4 selection circuits SL[k1], SL[k2], S[k3] and SL[k4] out of the selection circuits SL[1] to SL[7] are controlled (programmed) to respectively provide reference levels Vr[k1]=(Amin+A/5), Vr[k2]=(Amin+2*(A/5)), Vr[k3]=(Amin+3*(A/5)) and Vr[k4]=(Amin+4*(A/5)) to the associated 4 comparators M[k1], M[k2], M[k3] and M[k4] among the comparators M[1] to M[7]. In response to the 4 comparison results C[k1], C[k2], C[k3] and C[k4] of the 4 comparators M[k1], M[k2], M[k3] and M[k4], the slicer 24 inverts the signal Fout whenever it crosses one of the reference levels Vr[k1], Vr[k2], Vr[k3[ and Vr[k4]. Equivalently, the slicer 24 generates the signal Fout by (Fref⊕C[k1]⊕C[k2]⊕C[k3]⊕C[k4]).

That is, for the frequency multiplier 20 to provide a programmable multiplication factor, the slicer 24 generates the signal Fout in response to a programmable subset of all the comparison results, such as the comparison results C[n1] and C[n2] for the multiplication factor equal to 3, or the comparison results C[k1], C[k2], C[k3] and C[k4] for the multiplication factor equal to 5; wherein the comparison results of the programmable subset are obtained in accordance with properly selected reference levels programmable to equally divide the peak-to-peak magnitude A by the multiplication factor, such as the reference levels (V[n1], V[n2])=(Amin+A/3, Amin+2*A/3) for the multiplication factor equal to 3, or the reference levels (V[k1], V[k2], V[k3], V[k4])=(Amin+A/5, Amin+2*A/5, Amin+3*A/5, Amin+4*A/5) for the multiplication factor equal to 5. With 7 comparators and properly selected reference levels, the frequency multiplier 20 can be programmed to provide a multiplication factor of 2 to 8. The voltage provider 26 can be implemented by resistor voltage divider(s).

Figure 4:
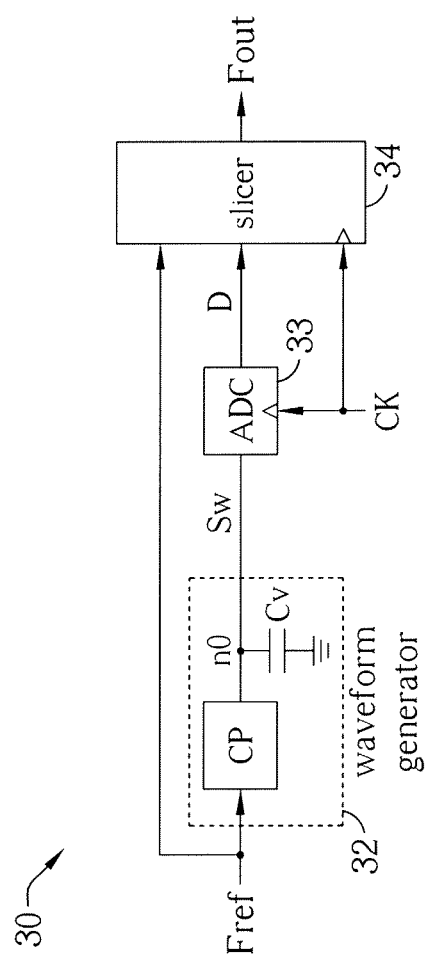
FIG. 4 illustrates a frequency multiplier according to an embodiment of the invention.

FIG. 4 illustrates a frequency multiplier 30 according to an embodiment of the invention. The frequency multiplier 30 provides a signal Fout in response to a signal Fref, such that a frequency (clock rate) of the signal Fout is a multiple of that of the signal Fref. The frequency multiplier 30 includes a waveform generator 32, a converter 33 and a slicer 34. Similar to the waveform generators 12 and 22, the waveform generator 32 provides a saw-tooth waveform Sw in response to the signal Fref, such that a period of the waveform Sw equals that of the signal Fref; in each period Tref of the signal Fref, the waveform Sw linearly ascends from a minimum to a maximum during a half of the period Tref, and descends from the maximum back to the minimum during the other half of the period Tref.

The converter 33, e.g., an analog-to-digital converter (ADC), is coupled between the waveform generator 32 and the slicer 34, and is triggered by a clock CK to periodically convert a sample of the waveform Sw to a digital code D during each period of the clock CK, such that the slicer 34 can induce a transition in the signal Fout whenever consecutive digital codes D cross one of a number of reference levels which equally divide a peak-to-peak magnitude of the waveform Sw by a multiplication factor. Hence, a frequency of the signal Fout is a product of the multiplication factor and a frequency of the signal Fref. By programming the reference levels, the frequency multiplier 30 is capable of providing a programmable multiplication factor. In an embodiment, a clock rate of the clock CK is higher than the frequency of the signal Fref. In an embodiment, the clock rate of the clock CK is also higher than the frequency of the signal Fout.

Figure 5:
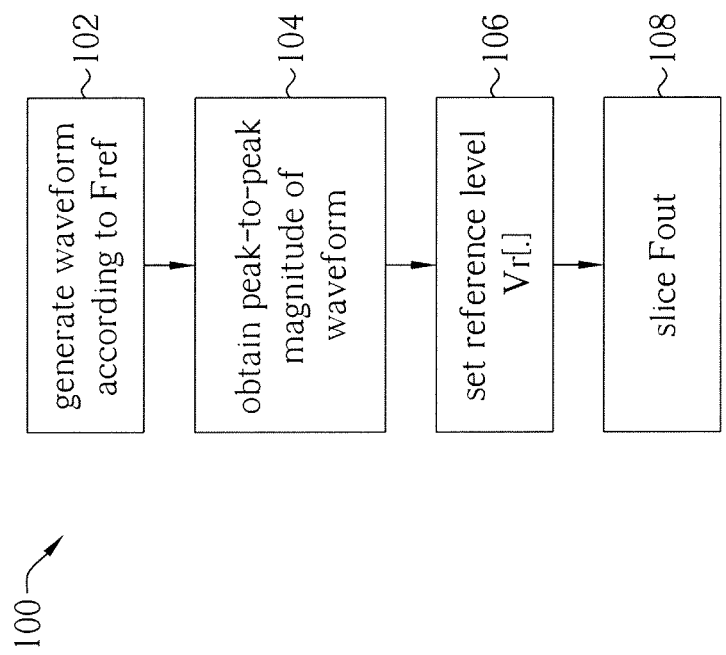
FIG. 5 illustrates a process flow for frequency multiplication according to an embodiment of the invention.

FIG. 5 illustrates a process flow 100 according to an embodiment of the invention, which is applied to provide a signal Fout in response to a signal Fref, such that a frequency of the signal Fout is equal to a product of a multiplication factor and a frequency of the signal Fref. Main steps of the flow 100 can be described as follows.

Step 102: generate a waveform Sw according to the signal Fref, such as the saw-tooth waveform Sw shown in FIG. 1 and FIG. 3. In an embodiment, step 102 is performed by shaping the waveform Sw into an ascending ramp when the signal Fref is of a first logic level, and shaping the waveform into a descending ramp when the signal Fref is of a second logic level.

Step 104: obtain a peak-to-peak magnitude A of the waveform Sw; for example, the magnitude A can be pre-defined by the designer, or can be measured by build-in auto-test mechanism or measurement.

Step 106: with the multiplication factor N determined, set a number of reference levels Vr[.] according to the multiplication factor. For example, to implement a multiplication factor equal to N, (N−1) reference levels are prepared, and values of the (N−1) reference levels are set to equally divide the peak-to-peak magnitude A of the waveform Sw by N; that is, each reference level Vr[n] is set according to a multiple of a quotient dividing the peak-to-peak magnitude A by the multiplication factor N, i.e., n*(A/N), for n=1 to (N−1).

Step 108: slice to provide the signal Fout by inverting the signal Fout whenever the waveform Sw intersects one of the reference levels. In an embodiment, step 108 is performed in cooperation with comparators; each comparator compares the waveform Sw with one of the reference levels to provide a comparison result, such that the signal Fout is inverted in response to the comparison results of the comparators. In an embodiment, step 108 is performed in cooperation with a converter which periodically converts a sample of the waveform Sw to a digital code, thus the output signal is inverted whenever consecutive digital codes intersect one of the reference levels.

Figure 6:
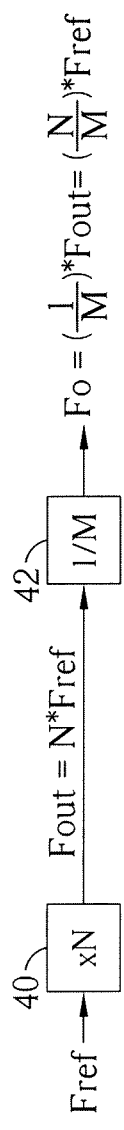
FIG. 6 illustrates an application including a frequency multiplier according to an embodiment of the invention.

FIG. 6 illustrates an application of the frequency multiplier according to the invention. A frequency multiplier 40 of the invention can cooperate with a frequency divider 42. The frequency multiplier 40 can be one of the frequency multipliers 10 (FIG. 1), 20 (FIG. 2) or 30 (FIG. 4) for multiplying a frequency (or clock rate) of a signal Fref by a multiplication factor N to provide a signal Fout. The frequency divider 42 divides a frequency of the signal Fout by a division factor M, and generates a signal Fo in response. Therefore, a frequency of the signal Fo equals a product of a combined factor (N/M) and the frequency of the signal Fref.

In an embodiment, the signal Fref is provided by an oscillator of a phase lock loop (not shown), and the signal Fo is utilized to generate a local oscillation signal (or a carrier signal) for signal mixing, e.g., signal modulation for a transmitter or signal demodulation for a receiver. By properly setting the multiplication factor N and the division factor M, the combined factor (N/M) can be a non-integer instead of an integer; thus, harmonic frequencies of the local oscillation signal will not coincide with the frequency of the signal Fref, and interference (e.g., frequency pulling) between the local oscillation signal and the oscillator signal Fref can be effectively reduced.

Figure 7:
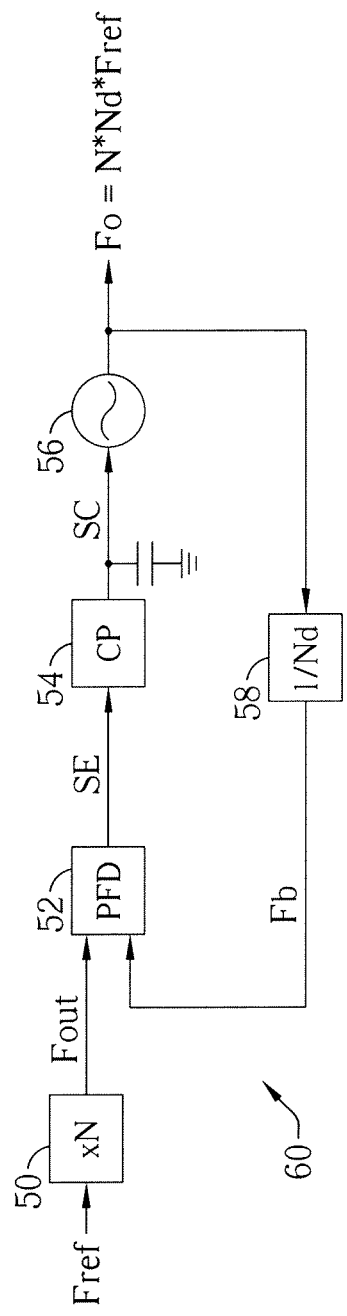
FIG. 7 illustrates a phase lock loop including a frequency multiplier according to an embodiment of the invention.

FIG. 7 illustrates a phase lock loop (PLL) 60 according to an embodiment of the invention. The PLL 60 includes a frequency multiplier 50, a phase/frequency error detector (PFD) 52, a charge pump 54, an oscillator 56 (e.g., a voltage-controlled oscillator) and a frequency divider 58. The frequency multiplier 50 can be implemented by the frequency multiplier 10 (FIG. 1), 20 (FIG. 2) or 30 (FIG. 4) which multiplies a frequency (or clock rate) of a signal Fref by a multiplication factor N to provide a signal Fout. The PFD 52 detects difference between frequencies/phases of the signal Fout and a signal Fb, and provides a signal SE in response. The charge pump 54 charges and discharges a capacitor in accordance with the signal SE and provides a signal SC. The oscillator 56 adjusts frequency of the signal Fo in response to the signal SC. The frequency divider 58 divides a frequency of the signal Fo by a division factor Nd to form the signal Fb. Therefore, when the PLL 60 achieves frequency/phase lock, the frequency of the signal Fo is a product of a combined factor (N*Nd) and the frequency of the signal Fref. By introducing the frequency multiplier 50 into the PLL 60 to provide the additional multiplication factor N, the division factor Nd can be set to a smaller value while the combined factor (N*Nd) remains unchanged; hence, the PLL 60 can gain better in-band noise performance and avoid spurious problem due to the smaller division factor Nd.

Moreover, the frequency multiplier according to the invention can be utilized alone to provide a high-frequency output signal from a low-frequency input signal, and the high-frequency output signal can be used as a clock for any circuit block which requires clock.

To sum up, compared to prior art approaches, frequency multiplication according to the invention can implement multiplication factor of arbitrary numbers instead of even numbers and a finite quantity of special numbers, and avoid use of high-cost elements for filtering harmonics of mixing. In addition, the multiplication factor of frequency multiplication can be programmed by software, firmware and/or hardware.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A frequency multiplier for providing an output signal in response to an input signal, and comprising:
   a waveform generator for generating a waveform in response to the input signal;
   a slicer coupled to the waveform generator for inducing transitions in the output signal whenever the waveform crosses each of a plurality of reference levels;
   a plurality of comparators, wherein each of the comparators is coupled between the waveform generator and the slicer, and is arranged to provide a comparison result in response to a comparison between the waveform and one of the reference levels; the slicer is arranged to induce transitions in the output signal in response to the comparison results of the comparators and
   a plurality of selection circuits, wherein each of the selection circuits is coupled to one of the comparators, and is arranged to provide one of the reference levels by selecting it from a plurality of candidate reference levels.

2. The frequency multiplier of claim 1, wherein the waveform generator shapes the waveform into an ascending ramp when the input signal is of a first logic level, and shapes the waveform into a descending ramp when the input signal is of a second logic level.

3. The frequency multiplier of claim 1, wherein the reference levels are programmable, and the slicer is capable of inducing transitions in the output signal in response to a programmable subset of the comparison results.

4. The frequency multiplier of claim 3, wherein a period of the input signal is a multiplication of a multiplication factor and a period of the output signal, and, the reference levels and the subset are programmed according to the multiplication factor.

5. The frequency multiplier of claim 1 further comprising:
   a voltage provider for providing the candidate reference levels for each of the selection circuits.

6. The frequency multiplier of claim 1 further comprising:
   a converter for periodically converting a sample of the waveform to a digital code, and the slicer is arranged to induce the transition in the output signal when consecutive digital codes cross one of the reference levels.

7. The frequency multiplier of claim 1, wherein each of the reference levels is a fraction of a peak-to-peak magnitude of the waveform.

8. The frequency multiplier of claim 1, wherein the reference levels equally divide a peak-to-peak magnitude of the waveform.

* * * * *